United States Patent [19]

Kernander et al.

[11] 4,071,824
[45] Jan. 31, 1978

[54] SHROUDED JAWS FOR HOOK-ON TYPE INSTRUMENTS

[75] Inventors: Warren N. Kernander, Boxford; Carl F. Van Bennekom, Lynnfield, both of Mass.

[73] Assignee: General Electric Company, Schenectady, N.Y.

[21] Appl. No.: 729,588

[22] Filed: Oct. 4, 1976

[51] Int. Cl.² .................. G01R 1/20; H01F 17/06
[52] U.S. Cl. ............................ 324/127; 336/176
[58] Field of Search ............... 324/127, 117 R, 117 H, 324/129; 336/176

[56] References Cited

U.S. PATENT DOCUMENTS 2,663,845  12/1953  Koch ................................. 324/127
2,842,739  7/1958   Lamb ................................. 324/127

Primary Examiner—Rudolph V. Rolinec
Assistant Examiner—Ernest F. Karlsen

[57] ABSTRACT

A pair of relatively movable, shrouded jaws are provided for a hook-on type measuring instrument to insulate the conductive ends of the jaws from contact with high voltage electrical conductors on which the instrument is periodically clamped during its normal application. The shrouded ends of the jaws are characterized by incorporating cup-shaped insulated recesses within which the uninsulated ends of the soft iron magnetic ends of the jaws are disposed substantially below the outwardly extending lips of the recesses thereby to prevent the iron from being inadvertently placed in contact with a high voltage conductor when the jaws are opened to either place them around such a conductor or to remove them therefrom.

5 Claims, 3 Drawing Figures

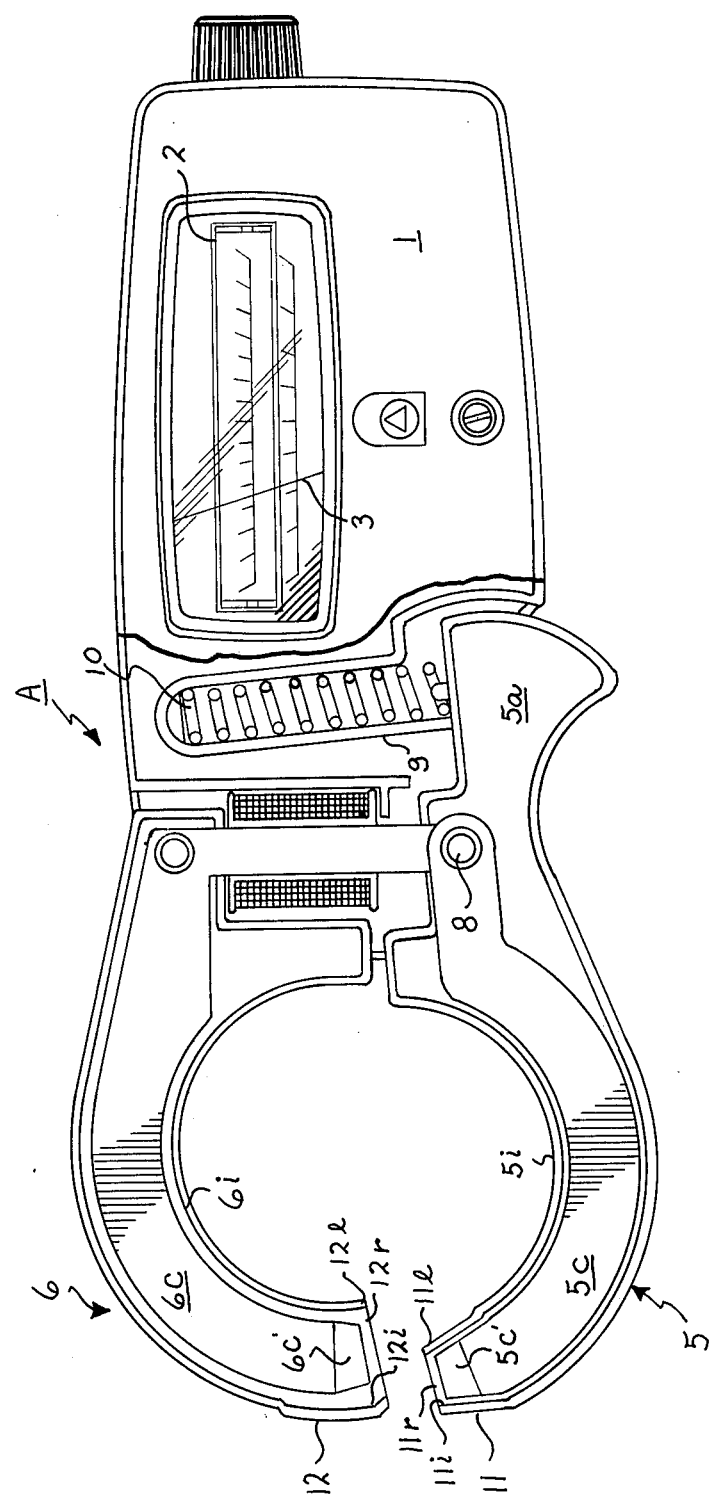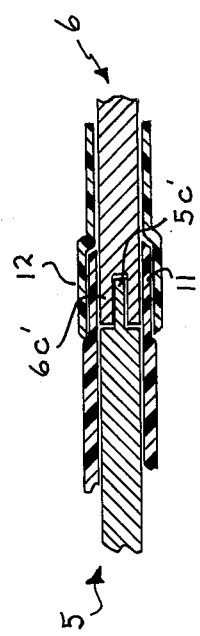
FIG.2
FIG.3

SHROUDED JAWS FOR HOOK-ON TYPE INSTRUMENTS

BACKGROUND OF THE INVENTION

The invention relates to a jaw structure for alternating current instruments of the type commonly used as clamp-on, or hook-on voltmeters and ammeters that sense the magnetic field strength around a current carrying conductor, and more particularly, the invention relates to a shrouding means for the ends of such instrument jaws to protect an operator handling the instrument from the hazard of electrical shock that might be transmitted through the jaws to the instrument, if the iron material in the jaws were permitted to come in contact with a high voltage electrical conductor.

Heretofore, it has been common practice to provide hand-held, clamp-on ammeters and voltmeters with relatively movable soft iron jaws that are either completely uninsulated or that are only insulated completely from an encircled high voltage conductor when the jaws of the instrument are in their closed position. An example of the uninsulated prior art type of clamp-on instrument jaws to which reference is made is shown in U.S. Pat. No. 3,168,698 which issued on Feb. 2, 1965. Such uninsulated clamp-on jaw arrangements are relatively safe for the low voltage applications normally anticipated for the type of hand-held instrument described in that patent. However, for current and voltage monitoring clamp-on type instrument adapted for use in monitoring higher voltage conductors, it is more common to use clamp-on jaw structures that define a substantially insulated conductive loop when the jaws are positioned in their operating, or closed position. An example of such a pair of partially insulated jaws is shown in U.S. Pat. No. 3,611,136 which issued on Oct. 5, 1971. The type of insulated jaw arrangement shown in this latter patent provides considerable protection to the operator of a hand-held instrument because it is only possible for an electrical shock to be transmitted from a high voltage conductor to the jaws of the instruments when the jaws are in their open position. Moreover, since only one of the ends of the jaws of the instruments is completely exposed to contact with such a conductor when the jaws are in their open position, the risk of such a shock hazard is at least somewhat reduced. Still, it has been recognized that it would be possible for the one exposed jaw end on such an instrument to come into contact with a high voltage conductor and thereby possibly induce a harmful high voltage into the instrument and thence to an operator.

While the potential hazard of a high voltage shock inherent in prior art type uninsulated and partially insulated clamp-on jaw structures has long been recognized, a satisfactory alternative jaw structure has not heretofore been developed so far as is known. Such a lag in development may be due, in part, to the need to accommodate any safety or shielding insulating structure to the basic operating requirement of the jaws that makes it necessary to avoid any shielding structure that might prevent proper transformer action from occurring in the loop defined by the jaws when they are moved to their closed, conductor encircling position. Of course, any such improper transformer action resulting from only partial closing of such jaws could result in large instrument errors.

Accordingly, it is a primary object of the present invention to provide a pair of relatively movable hook-on type jaws for a measuring instrument with shrouding means that effectively protect the conductive ends of the jaws from being engaged by a high voltage conductor when the jaws are in their open position during movement of the jaws toward or away from a conductor with which the instrument is being used.

Another object of the invention is to provide a hook-on type instrument with a pair of relatively movable insulated jaws having shrouding means at the respective outer ends thereof to prevent a high voltage conductor from engaging said outer ends.

Yet another object of the invention is to provide a pair of shrouded jaws, for a hook-on type instrument, with shrouding means that are characterized by incorporating cup-shaped recess structures that enable the shrouding means to be closely nested within one another when the jaws are closed around a high voltage conductor.

Additional objects and advantages of the invention will become apparent from the description of it that follows taken in conjunction with the accompanying drawings.

SUMMARY OF THE INVENTION

In one preferred embodiment of the invention a pair or relatively movable, hook-on type insulated jaws for a magnetic field sensing instrument are provided, respectively, with shrouding means at the outer ends thereof for protecting the ends of the jaws from contact with high voltage electrical conductors. The shrouding means surrounding the outer ends of the jaws define cooperating, cup-shaped recesses having lips that extend upwardly beyond the respective exposed conductive jaw ends. The recesses are formed to provide a snug nesting relationship between the respective shrouding means on the two jaw ends as the jaws are moved into their closed position. When the jaws are in their open position, the shrouding means extend outward beyond the ends of the soft metal jaws and thus protect them from engagement by an electrical conductor relative to which the jaws may be moved during normal application of the instrument.

DESCRIPTION OF THE INVENTION

FIG. 1 is a side elevation view of a hand-held, hook-on type volt-ammeter having a pair of relatively movable insulated jaws provided, respectively, pursuant to the invention, with shrouding means at their outer ends for protecting the conductive metal end portions of the jaws from inadvertent contact with a high voltage conductor that may be encompassed by the jaws during normal application of the instrument, as illustrated with the jaws opened and positioned around such a conductor.

FIG. 2 is a fragmentary, side elevation view, partly in cross-section, showing the details of the shrouding means provided on the outer ends of the jaws of the instrument depicted in FIG. 1, also showing the jaws in an opened position.

FIG. 3 is a fragmentary view, in cross-section of the shrouded ends of the jaws of the instrument depicted in FIGS. 1 and 2 showing the jaws in their closed position.

BRIEF DESCRIPTION OF THE PREFERRED EMBODIMENTS

Figure 1:
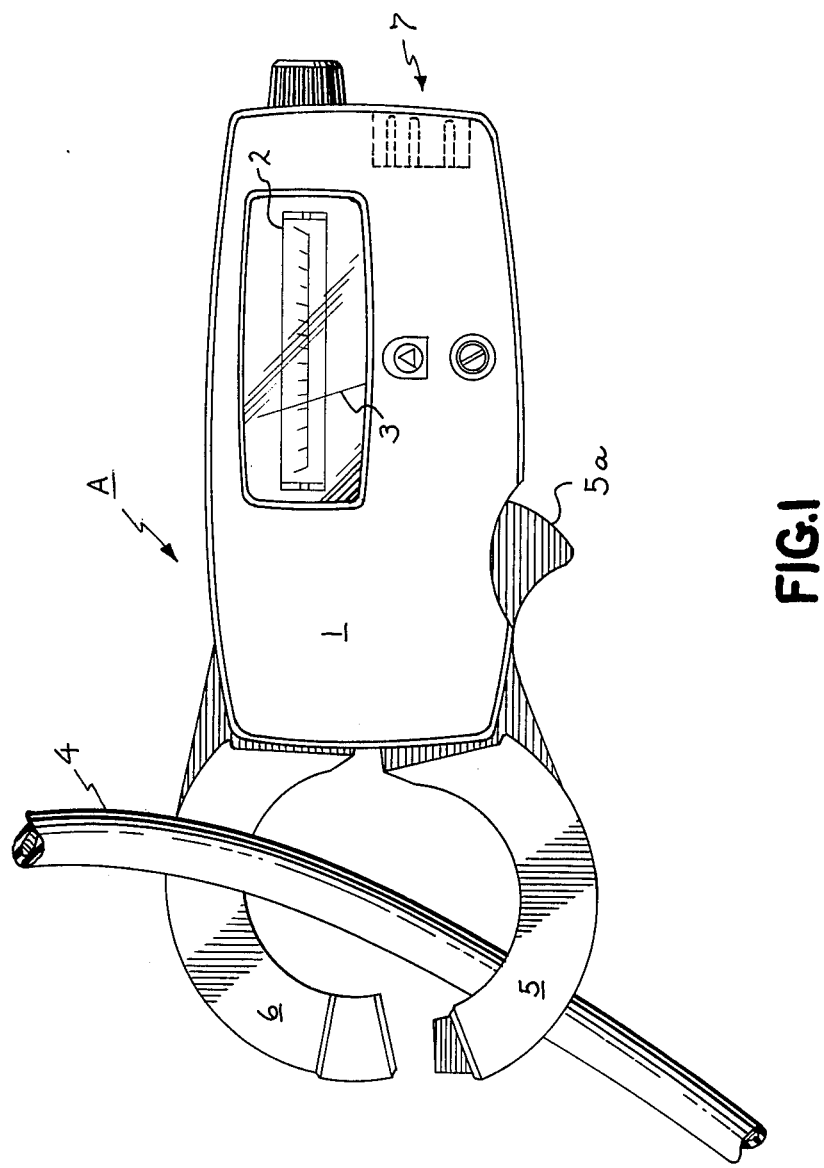

Referring now to FIG. 1 of the drawings, the structure and operation of one preferred form of the invention will be described. Thus, it will be seen that there is shown a hand-held instrument A having an insulating housing 1 that it will be understood may be suitable for any conventional type of ammeter, voltmeter, et cetera. The instrument A includes an indicating scale 2 with which a magnetically actuated vane 3 cooperates in a conventional manner to provide a scale indication proportional to a current or voltage sensed in a high voltage electrical conductor 4 that is encompassed by a pair of relatively movable jaws 5 and 6 that are operable in their enclosed position to define a low reluctance magnetic loop, or core for the instrument, in a well-known manner. The particular features of the instrument A described thus far are not of great importance to understanding the present invention; therefore, only a brief description of some of these features will be presented herein in order to appropriately orient the invention being described. Thus, it will be noted that the instrument housing 1 is provided with a plurality of socket-type conductor leads 7 that are adapted to be electrically connected to suitable hand-held probes, in the manner more fully described in co-pending U.S. patent application Ser. No. 655,315, filed on Feb. 4, 1976 and assigned to the assignee of the present invention. It will also be understood that the insulating housing 1 is formed of an impact-resistant insulating material so that the instrument can be safely held in an operator's hand while it is being used to monitor current in a conductor 4 around which the jaws 5 and 6 may be positioned.

As is conventional for such instruments, it will be noted that the pair of relatively movable, shrouded jaws 5 and 6 of the hook-on type measuring instrument illustrated in FIG. 1 are formed to define a closed conductive loop for encircling an electrical conductor, such as the conductor 4. Any conventional mounting means may be used for mounting the jaws 5 and 6 in their desired relatively movable relationship on the instrument housing 1 in order to enable the jaws to be moved from an open position such as that shown in FIG. 1 to a closed position such as that shown in FIG. 3.

In the form of the invention illustrated in FIGS. 1 and 2, the jaw 6 is mounted in fixed relationship by the mounting means on housing 1 in any well-known manner, such as by being bolted to the frame portion of housing 1. Likewise, the jaw 5 is pivotally mounted on a suitable pivot pin 8 (see FIG. 2) and comprises a conductor-encircling jaw portion that cooperates with the jaw 6, as well as a trigger portion 5a that is adapted to be manually depressed against a spring 10 when an operator wishes to open the jaws 5 and 6 to allow a conductor (4) to be received therein. Of course, the spring 10 moves the jaw 5 into its closed relationship with jaw 6 when operator pressure is released from the actuating trigger 5a.

Each of the jaws 5 and 6 is substantially completely covered with a suitable electrical insulating material, shown in cross-section at 5i and 6i in FIG. 2. Any conventional tough plastic insulating material may be used for this purpose. In order for the conductors of jaws 5 and 6 to perform their desired transformer action, it is necessary that the respective soft iron, laminated conductive cores 5c and 6c of the jaws 5 and 6 have their respective outer ends exposed for abutting engagement when the jaws 5 and 6 are moved into their closed, conductor-encircling relationship. Thus, the insulating coatings 5i and 6i may substantially cover the jaws 5 and 6, except for the shrouded portions thereof at the open ends of each of the jaws 5 and 6.

Pursuant to the present invention, a first insulated, conductor shrouding means 11 is positioned on the outer end of jaw 5 and defines a first cup-shaped recess 11r within which the uninsulated, shrouded portion of the end 5c' of conductor core 5c is disposed.

In somewhat similar manner, a second insulated conductor shrouding means 12 defines a second cup-shaped recess 12r within which the uninsulated, shrouded end 6c' of the other jaw core 6c is disposed. In order for the uninsulated ends 5c' and 6c' of the jaws 5 and 6 to have assured effective transformer coupling action when they are moved into their relatively closed positions, as shown in FIG. 2, the first and second shrouding means (11 and 12) are formed to cooperate in nesting relationship, as shown, so that primary initial contact occurs between the ends 5c' and 6c' of the conductive soft metal cores 5c and 6c of the respective jaws, rather than between the insulated cup-shaped portions of the shrouding means. This arrangement enables the shrouded ends of the jaws to be closed in a desired low reluctance relationship against one another.

To further ensure properly centered, firm engagement between the abutting ends 5c' and 6c' of the jaws 5 and 6, pursuant to the present invention, the respective inner surfaces 11i and 12i of the first and second cup-shaped recesses 11r and 12r are each tapered inwardly from their respective lips 11l and 12l toward their respective bases. This mutual tapered relationship helps assure that the two jaws will be centered upon one another, even if they are slightly misaligned as they are moved into their closed relationship. Preferably, the base portion of the first cup-shaped shrouding means 11 is substantially co-extensive with the end 5c' of the conductive jaw 5c on which it is mounted, and the second cup-shaped recess 12r defined by the other shrouding means 12 has a base portion substantially co-extensive with the outer perimeter of the lip 11l of the first shrouding means 11, as seen in FIG. 2.

In order to provide the deepest recess or greatest electrical insulating protection for the conductive jaw core 5c mounted on the pivotal jaw 5, due to its normal lowermost relationship in a typical hand grip operated instrument such as that shown with the illustrated meter, in the preferred embodiment of the invention the first cup-shaped recess 11R defined by shrouding means 11 on jaw 5 is preferably between about 50 percent and about 75 percent as deep as the second cup-shaped recess 12R defined by the shrouding means 12 on jaw 6.

It is most important for the proper practice of the present invention to assure that the respective lips 11l and 12l of the first and second cup-shaped recess 11r and 12r are formed to extend substantially outward beyond the respective uninsulated end portions 5c' and 6c' of the jaws 5 and 6. It has been found that this substantially outward extension of the lips 11l and 12l (see FIG. 2) should preferably be in a range from about ⅛ to about ¼ inch in order to adequately assure protection of the ends 5c' and 6c' of the jaws from inadvertent exposure to electrical contact with typically monitored high voltage conductors, such as the conductor 4 illustrated in FIG. 1.

It will be apparent to those skilled in the art that various modifications and alterations of the form of the invention described herein may be made without departing from the true spirit or scope of the invention. Accordingly, it is our intention to encompass within the following claims the appropriate scope of our invention.

What we claim as new and desire to secure by Letters Patent of the United States is:

1. A pair of relatively movable, shrouded jaws operably mountable on a hook-on type measuring instrument, said jaws being formed to define a closed magnetically conductive loop for encircling an electrical conductor, mounting means for mounting the jaws in relatively movable relationship on an instrument housing to enable the jaws to be moved from an open, conductor-receiving position to a closed, conductor-encircling position, each of said jaws being substantially completely covered with insulating material except for a shrouded portion at the open end of each jaw, a first insulated, conductor shrouding means extending beyond the end of one of said jaws defining a first cup-shaped recess within which the uninsulated, shrouded portion of said one of said jaws is disposed, and a second insulated, conductor shrouding means extending beyond the end of the other jaw defining a second cup-shaped recess within which the uninsulated, shrouded portion of said other jaw is disposed, said first and second shrouding means being formed to cooperate in nesting relationship thereby to enable the shrouded ends of the jaws to be closed in low reluctance relationship against one another.

2. An invention as defined in claim 1 wherein the first cup-shaped recess defined by the first shrouding means has a base portion substantially co-extensive with the end of the conductive jaw on which it is mounted, and the second cup-shaped recess defined by the second shrouding means has a base portion substantially co-extensive with the outer perimeter of the lip of the first shrouding means.

3. An invention as defined in claim 2 wherein said first cup-shaped recess in between about 50 and about 75 percent as deep as said second cup-shaped recess.

4. An invention as defined in claim 3 wherein the respective lips of said first and second cup-shaped recesses are formed to extend substantially outward beyond the respective uninsulated portions of the jaws.

5. An invention as defined in claim 4 wherein said substantially outward extensions of said lips are in the range of about $\frac{1}{8}$ to about $\frac{1}{4}$ inch.

* * * * *